United States Patent [19]
Higgins, Jr.

[11] Patent Number: 5,585,770
[45] Date of Patent: Dec. 17, 1996

[54] THREE TERMINAL SURFACE ACOUSTIC WAVE (SAW) DEVICE

[75] Inventor: Robert J. Higgins, Jr., Plantation, Fla.

[73] Assignee: Motorola, Inc., Schaumburg, Ill.

[21] Appl. No.: 508,414

[22] Filed: Jul. 28, 1995

Related U.S. Application Data

[63] Continuation of Ser. No. 286,895, Aug. 8, 1994, abandoned, which is a continuation of Ser. No. 85,526, Jun. 30, 1993, abandoned.

[51] Int. Cl.$^6$ .................................................. H03H 9/64
[52] U.S. Cl. .................. 333/193; 333/195; 310/313 R; 310/313 B
[58] Field of Search ................................ 333/193, 194, 333/195, 196; 310/313 R, 313 B, 313 C, 313 D

[56] References Cited

U.S. PATENT DOCUMENTS

| | | | |
|---|---|---|---|
| 3,600,710 | 8/1971 | Adler . | |
| 3,675,054 | 7/1972 | Jones et al. . | |
| 3,868,608 | 2/1975 | Williams . | |
| 4,223,284 | 9/1980 | Inoue et al. | 333/150 |
| 4,384,264 | 5/1983 | Kadota | 333/193 |
| 4,571,519 | 2/1986 | Kawabata et al. | 310/313 A |
| 5,093,638 | 3/1992 | Kinsman et al. | 333/195 |
| 5,184,042 | 2/1993 | Kadota et al. | 333/193 |

FOREIGN PATENT DOCUMENTS

| | | |
|---|---|---|
| 0107319 | 8/1980 | Japan . |
| 0287106 | 11/1988 | Japan . |
| 0304707 | 12/1988 | Japan . |
| 0265211 | 11/1991 | Japan . |
| 2145596 | 3/1985 | United Kingdom . |

OTHER PUBLICATIONS

"Saw If Filter on LitaO$_3$ For Color TV Receivers" *IEEE Transactions on Consumer Electronics* vol CE–24, No. 3 Aug. 78 pp. 337–348.

*Primary Examiner*—Benny Lee
*Assistant Examiner*—Darius Gambino
*Attorney, Agent, or Firm*—Andrew S. Fuller

[57] ABSTRACT

A three-terminal resonator device (200) resonant at a resonant frequency has a first terminal (201), a second terminal (202), and a common terminal (203). The resonator includes a surface acoustic wave transducer (290) disposed on a piezoelectric substrate (201). The SAW transducer (290) is comprised of a first sub-transducer (210) and a second sub-transducer (220) which respectively include a first set of electrodes (211,213) and a second set of electrodes (221, 223). One of the electrodes of each of the first set and the second set of electrodes respectively provide the first terminal (201) and the second terminal (203). The other terminals of the first and second set of electrodes are connected at the common terminal (203) to provide a serial connection between the first sub-transducer (210), and the second sub-transducer (220).

7 Claims, 4 Drawing Sheets

300

400

THREE TERMINAL SURFACE ACOUSTIC WAVE (SAW) DEVICE

This is a continuation of application Ser. No. 08/286,895 filed Aug. 8, 1994 and now abandoned, which is a continuation of application Ser. No. 08/085,526, filed Jun. 30, 1993, and now abandoned.

CROSS REFERENCE TO RELATED APPLICATIONS

This application is a related to U.S. patent application entitled "A Tunable Oscillator Having a Surface Acoustic Wave Transducer," by Robert J. Higgins, Jr., Attorney Docket No. CM01515J, filed concurrently herewith and assigned to Motorola, Inc.

TECHNICAL FIELD

This invention relates generally to Surface Acoustic Wave (SAW) devices and more particularly to a three-terminal SAW device.

BACKGROUND

SAW components use acoustic waves which travel at the speed of sound. The SAW components are preferred over widely used transmission line components because acoustic waves have a substantially shorter wave length at operating frequency than electromagnetic waves which travel at the speed of light. Therefore, for a given operating frequency, SAW devices provide a smaller structure than a transmission line structure, making them suitable for miniaturized radio frequency applications. Furthermore, SAW devices are integratable with other active circuits, such as amplifiers and mixers, which are produced using conventional integrated circuit technologies. For the above reasons, the popularity of SAW structures in radio frequency applications, especially in resonator filter applications, has been steadily increasing.

FIG. I depicts a conventional SAW resonator structure 100 which includes a SAW transducer 110 and a pair of reflectors 120 disposed on a piezoelectric substrate 105. As is well known, the reflectors increase the quality factor of the SAW resonator by preventing dissipation of surface acoustic waves emanating from the SAW transducer 110 near the resonant frequency. The SAW transducer 110 comprises a first electrode 112 having a first set of open-ended fingers 114 and a second electrode 116 having a second set of open-ended fingers 118. The first electrode 112 and the second electrode 116 comprise conductive layers patterned on the piezoelectric substrate such that a first set of fingers 114 and a second set of fingers 118 are interdigitated in relation to each other. Conventionally the substrate 105 is made of a material with low temperature coefficient, such as quartz. As such, the SAW resonator is used in applications where stable, high frequency (within 100 MHz–1000 MHz range) source is desired.

Electric oscillators are extensively used in many applications where there is a need to generate one or more predetermined frequency output. For example, in frequency modulation (FM) radio frequency (RF) communication, RF receivers and RF transmitters use oscillators for generating carrier frequencies. Generally, oscillators operate at a particular resonant frequency. An oscillator's resonant frequency is determined by reactive elements of a tank circuit which comprises capacitive and inductive components. In conventional voltage controlled oscillators (VCOs), a variable reactive element in the tank circuit controls the resonant frequency of the oscillator. Often, the variable element is a two-terminal, nonlinear capacitor, such as a semiconductor varactor, which is responsive to a control signal for controlling its capacitance. Such tank circuit resonators provide a very wide tuning range (i.e. in the range of 3 MHz to 30 MHz) which makes them particularly suitable in frequency synthesized land-mobile communication applications.

Conventionally, transmission lines and coaxial distributed structures have been used as a substitute for the inductive component of the tank circuit. However, the fundamental companion element to the variable capacitor has relied upon magnetic field storage to provide the inductive reactance necessary to resonate the oscillator with the variable capacitor. As the inductor's size is reduced, the resonator's quality factor, Q, decreases. Decreased quality factor, has a number of undesired consequences, namely, degradation of VCO's sideband noise performance and desensitization of the receiver in the presence of a strong adjacent channel carrier signal. Additionally, because an inductor's magnetic field is very difficult to shield, VCO generated signals, spurious or otherwise, are undesirably coupled to the surrounding circuit.

Another problem frequently encountered in conventional VCOs, is a phenomenon known as "microphonics" which adversely affects an FM receiver's performance. Microphonics is a phenomenon whereby mechanical vibrations around the VCO structure are picked up by the electromagnetic inductor, thereby changing its effective inductance. As such, the resonant frequency of the VCO is changed. Since, in FM systems, the frequency changes are demodulated, the resonant frequency changes are manifested as undesired hum and noise which adversely affect the receiver's audio output.

Historically, SAW resonators have not been used as oscillators in land-mobile communication because it is extremely difficult to get the resonant frequency to change, over a wide tuning range, with a variable capacitor. Typically, the tuning range of for a 900 MHz SAW resonator has been in the range of only a few kilo-hertz, whereas, in land-mobile applications, a typical VCO in that frequency range must tune in megahertz range. In a related co-pending U.S. patent application entitled "A Tunable Oscillator Having A Surface Acoustic Wave Transducer", filed concurrently herewith and assigned to assignee of the present application, which is hereby incorporated by reference, the applicant of the present invention has disclosed a two-terminal SAW device structure which uses inductive properties of a SAW resonator to provide a substantially wide tuning range in an oscillator circuit. This two-terminal SAW device is coupled to external components which receive oscillation feed back from an active device. In some conventional oscillator designs, the oscillation feed back from the active device is fed into an electromagnetic three terminal device, such as a tapped inductor. Having described the problems associated with electromagnetic device, there exist a need for a three-terminal SAW device which behaves as a tapped inductor.

SUMMARY OF THE INVENTION

Briefly, according to the invention, a three-terminal SAW device resonant at a resonant frequency has a first terminal, a second terminal, and a common terminal. The SAW device includes a piezoelectric substrate upon which a SAW transducer for generating acoustic waves is disposed. The SAW transducer has a first sub-transducer and a second sub-transducer. The first sub-transducer consists of a first set of two electrodes, and the second sub-transducer which is acoustically coupled to the first sub-transducer, consists of a second set of two electrodes. One of the electrodes of the first set of electrodes provides the first terminal, and one of the electrodes of the second set of electrodes provides the second terminal. The other electrodes of the first and the second set of electrodes are connected to each other at the common terminal to provide serial connection between the first and the second sub-transducers such that the acoustic waves generated by the SAW transducers are in phase at the resonant frequency.

BRIEF DESCRIPTION OF THE DRAWINGS

FIG. I depicts a diagram of a prior art SAW filter structure.

DETAILED DESCRIPTION OF THE PREFERRED EMBODIMENT

Figure 1:
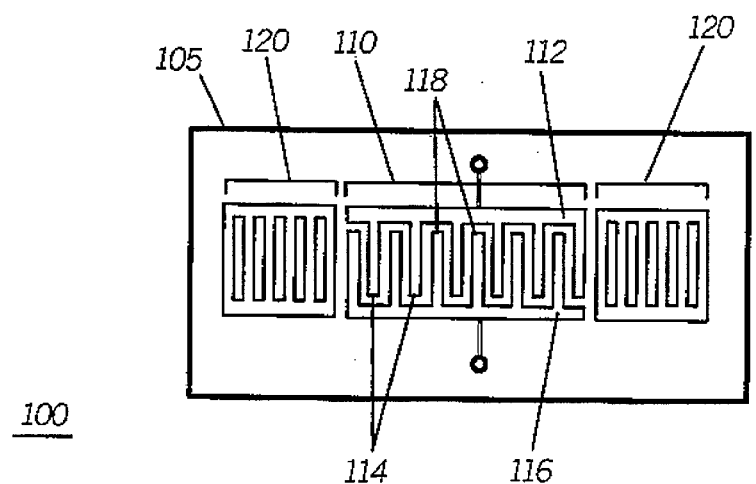

While the specification concludes with claims defining the features of the invention that are regarded as novel, it is believed that the invention will be better understood from a consideration of the following description in conjunction with the drawing figures, in which like reference numerals are carried forward.

Figure 2:
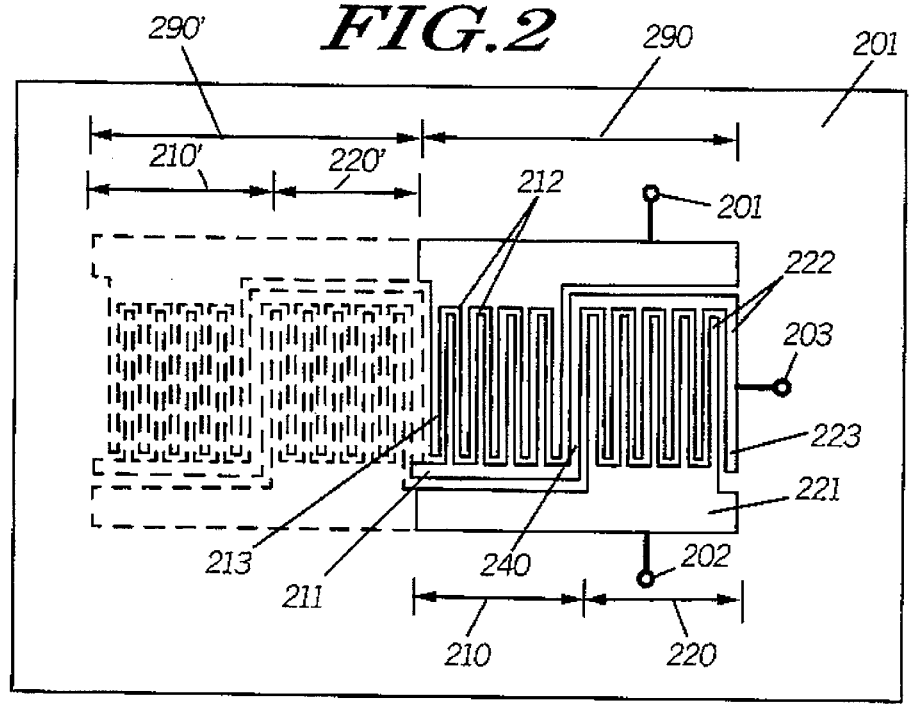
FIG. 2 shows top plan view of three-terminal SAW device of the present invention.

Referring to FIG. 2, a top plan view of the SAW device of the present invention is shown. The SAW device 200 is a three-terminal SAW device having a first terminal 201, a second terminal 202, and a common terminal 203. The SAW device 200 is comprised of a piezoelectric substrate 201 upon which conductive patterns constituting a SAW transducer 290 is disposed. As such, the SAW device 200 is resonant at a frequency as determined by the physical characteristics of the transducer 290 and the substrate 20 1. The substrate 20 1 is made of a suitable piezoelectric material which, as described later, possesses the appropriate properties for producing a desired frequency response characteristics. The transducer 290 may be disposed on the piezoelectric substrate 301, utilizing any number of suitable techniques, such as thin film evaporation, or sputtering with photo-lithographic definition. When an electrical signal is applied across any two terminals of the SAW device 200, surface acoustic waves propagate on the surface of the piezoelectric substrate creating desirable frequency characteristics.

The SAW transducer 290 is patterned to include a plurality of sub-transducers consisting of a first sub-transducer 210, and a second sub-transducer 220. The first sub-transducer 210 and the second sub-transducer 220 are disposed side by side to be acoustically coupled to each other. The first sub-transducer 210 comprises a first upper electrode 213 and a first lower electrode 211 with a first number of interdigitated fingers 212. The second sub-transducer 220 has a second upper electrode 223 and a lower electrode 221 with a second number of interdigitated fingers 222. As is well known, the interdigitated open ended fingers 221 and 222 are equally spaced and the spacing corresponds to the resonant frequency of the SAW device 200. According to the invention, the first and the second sub-transducers 210 and 220, are electrically coupled to each other in series such that the acoustic waves generated by the SAW transducer 290 are in phase at the resonant frequency. In the SAW device 200, the first terminal 201 is provided by the first upper electrode 213, and the second terminal 202 is provided by the second lower electrode 221. The first lower terminal 211 and the second upper terminal 223 are electrically coupled to each other in series via a common electrode 240 and terminate at the common terminal 203. In this arrangement, the electrodes 211 and 223 are serially coupled to each other where the phase of the propagating surface acoustic waves are not changed as they travel across the transducer 290 of the resonant frequency. As such, the electrodes of the acoustically coupled first sub-transducer 210 and the second sub-transducer 220 are electrically coupled to each other in series such that the acoustic waves generated by the transducer 290 are in phase with each other.

It is also contemplated that a second transducer portion may be added on the piezoelectric substrate 201 to complement the performance of the SAW device 200 to produce a desired frequency response. One such transducer portion is shown by a dotted line and is designated by the reference numeral 290' which is electrically and acoustically coupled to the first transducer 290 as illustrated. The second transducer portion 290 portion is arranged identical to that of the transducer portion 290 and includes sub-transducers 210' and 220'. The sub-transducers 210' and 220' are electrically coupled to each other identical to the arrangement described in conjunction with the transducer 290. Furthermore, the transducer 290 is electrically coupled to the transducer 290' by connecting the sub-transducer 210' and 210 in parallel to each other. The parallel arrangement is provided by connecting the upper electrodes of the sub-transducers 210' and 210 to each other and likewise by connecting the lower electrodes of the sub-transducers 220 and 220' to each other. As illustrated, the lower electrode of the sub-transducers 210 and the upper electrode of the sub-transducer 220 are directly coupled to each other via the extension of the common track 240 which terminates at the common terminal 203. It may be appreciated that the parallel coupling of the sub-transducers 210 and 210' and parallel connection of the sub-transducers 220 and 220' correspondingly increases the number of interdigitated fingers of the SAW device 200. As a result the quality factor of the resonant SAW device 200 is increased as described later in detail. Accordingly, the further including a second transducer comprising a plurality of serially coupled sub-transducers, wherein at least one of either the sub-transducers 210' or 220' of the second transducer 290' is connected in parallel to one of the first sub-transducer 210 or the second-sub-transducer 220.

It may be appreciated that the SAW device 200 may include acoustic wave reflectors disposed on each side of the transducer 290 (or the combination of transducer 290 and 290') to reflect the propagating acoustic waves. However, as described later in detail, in tunable oscillator application according to one aspect of the present invention, it is contemplated that the SAW device 200 be non-reflective (i.e., without reflectors) in order to provide wider tuning range.

Figure 3:
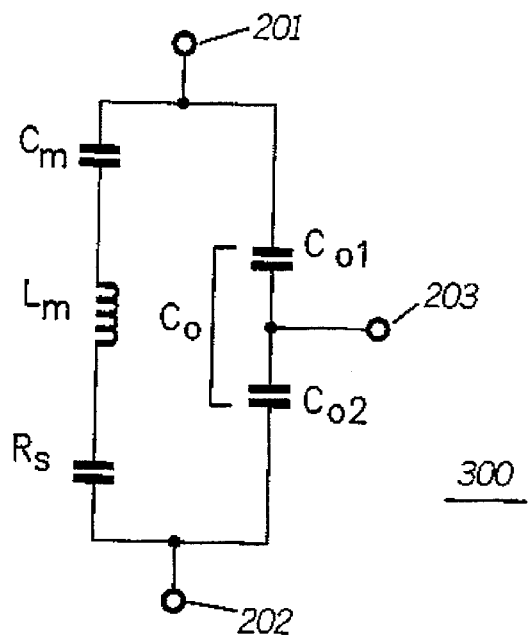
FIG. 3 shows an equivalent circuit diagram of the SAW device of FIG. 2.

Referring to FIG. 3, an equivalent circuit 300 for the SAW device 200 of FIG. 2, which models effects of the acoustic circuit from an electrical perspective, is shown. As illustrated, the equivalent circuit 300 is represented by a parallel network of an electrically capacitive branch comprising capacitors $C_{01}$ and $C_{02}$ and a branch of serially coupled motional capacitance $C_m$, motional inductance $L_m$ and resistance Rs. The capacitive branch of capacitors $C_{01}$ and $C_{02}$ correspond to the electrical serial connection between the first sub-transducer 210 and the second sub-transducer 220. The resultant capacitance of $C_{01}$ and $C_{02}$ is designated by a capacitance $C_0$ which represents the overall electrical capacitance of the transducer 290. Depending on the frequency of operation, SAW devices are capable of exhibiting both capacitive and inductive characteristics. For frequencies above the series resonance of $C_m$ and $L_m$ and below the parallel resonance across terminals 201 and 203 the circuit 300 exhibits inductive characteristics. For frequencies below the series resonance of $C_m$ and $L_m$ and above the parallel resonance across terminals 201 and 203, the circuit 300 exhibits capacitive characteristics. The frequency range within which the SAW device 200 exhibits inductive properties is designated as inductive frequency range. Similarly, the frequency range within which the SAW device 200 exhibits capacitive properties is designated as capacitive frequency range.

Figure 4:
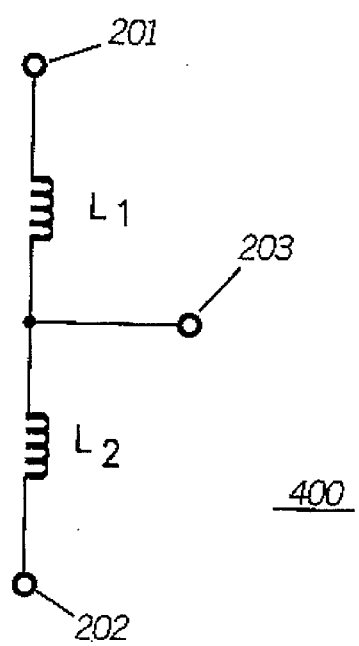
FIG. 4 shows another equivalent circuit diagram of the SAW device of FIG. 2.

Referring to FIG. 4, an equivalent circuit 400 is shown representing the inductive properties of the SAW device 200 within its inductive frequency range by a tapped inductive network. As shown, the circuit 400 comprises two serially coupled inductors L1 and L2 being tapped at the common terminal 203. It may be appreciated that the SAW device 200 can appear as a tapped capacitor in its capacitive frequency range. However, in tunable oscillator application, the inductive properties of the SAW device 200 are more desirable as they can be tuned to resonate with a variable capacitive tuning mechanism, such as a varactor. The tap ratio corresponds to the inductive characteristics of the inductors $L_1$ and $L_2$. As is well known, in electromagnetic inductors, the tap ratio is related to the winding ratio of the inductors $L_1$ and $L_2$. In the SAW device 200, the tap ratio is related to the ratio of the first number of fingers of the first sub-transducers 210 to the second number of fingers of the second sub-transducers 220. In other words, the amount of inductive (or capacitive) coupling between the common terminal 203 and the first terminal 201 and the second terminal 202 is dependent upon the ratio of first number of fingers to the second number of fingers.

Figure 5:
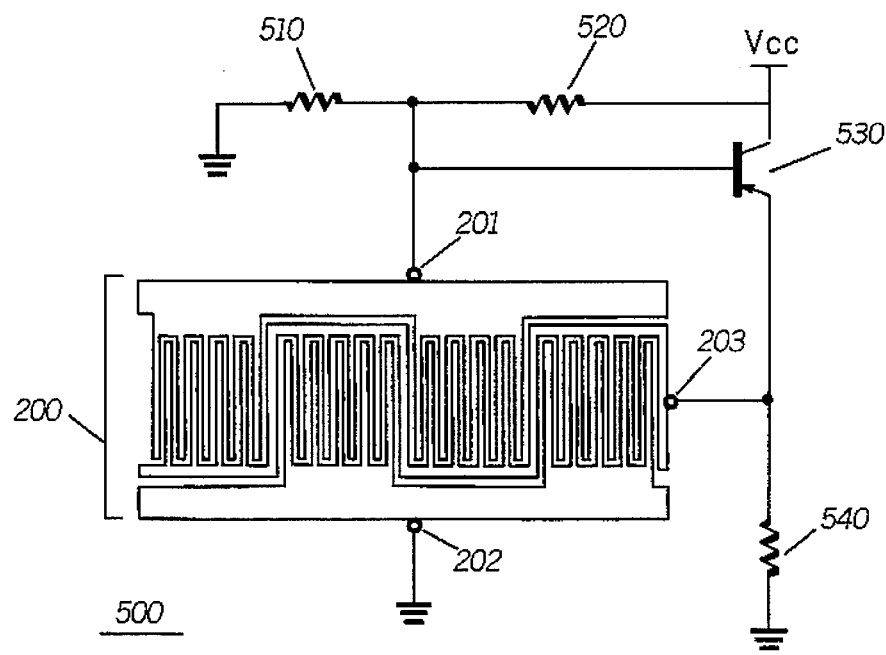
FIG. 5 is a schematic diagram of an oscillator circuit which uses the three terminal SAW device of present invention.

Referring to FIG. 5, the schematic diagram of a simple oscillator circuit 500 which utilizes the three-terminal SAW device 200 of the present invention is shown. As shown, the SAW device 200 is coupled to an active stage comprising a transistor 530 which is biased, in a well known manner, by a supply voltage Vcc and resistors 510, 520 and 540 to provide a gain of greater than unity. The first terminal 201 of the SAW device 200 is coupled to the input base of the transistor 530, and the second terminal 202 is grounded. The common terminal 203 is coupled to the emitter of the transistor 203. It is well known that an oscillator circuit is a closed loop circuit having an active stage with a gain of greater than unity, where its output is positively fed back to the input to cause oscillation. In the oscillator circuit 500, the output of the active transistor stage 530 is positively fed back to the input by means of the three-terminal SAW device 200. The output the oscillator circuit 500 taken at the emitter of the transistor 530 is coupled to the common terminal 203 which in this arrangement acts as the feed back coupling port.

Figure 6:
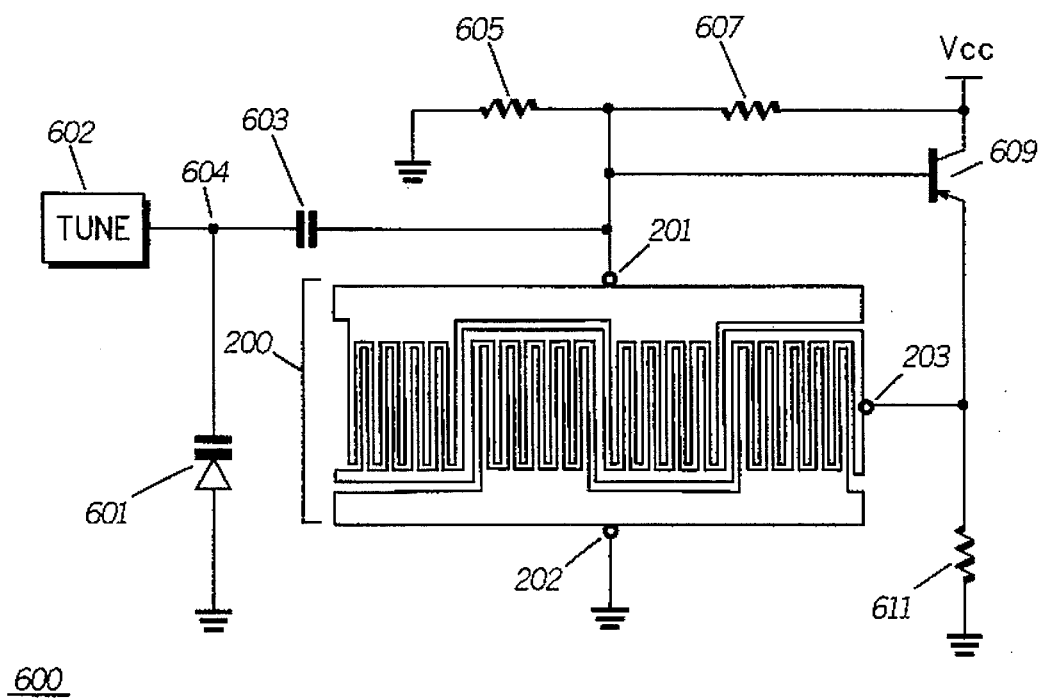
FIG. 6 is a schematic diagram of a tunable voltage controlled oscillator circuit which uses the three terminal SAW device of present invention.

Referring to FIG. 6, a schematic diagram of a voltage controlled oscillator (VCO) 600, according to the present invention, is shown. The VCO 600 provides a frequency output which is tunable within a predetermined tuning range. The VCO 600 includes the SAW device 200 of the present invention constructed to be resonant at an output frequency. The three-terminal SAW device 200 is coupled across a varactor 601 via terminals 201 and 203 producing the frequency oscillating portion of the VCO 600. The varactor 601 is responsive to a tuning signal generated by a tuning signal source 602 for varying the output frequency of the VCO 600 across the tuning range. The tuning signal is received at a tuning port 604 and applied to the varactor 601. Through a coupling capacitor 603, the VCO 600 utilizes inductive properties of the SAW device 200 to resonate the oscillator portion of the VCO 600, thus, replacing the electromagnetic inductor used in conventional VCO designs. The combined effect of the parallel arrangement of the inductive property of the SAW device 200 and the capacitive property of the varactor 209 causes the VCO to be resonant at a specific frequency. As is well known capacitive variations across the varactor 601 in response to the tuning signal tunes the frequency output within the tuning range. As such, the varactor 601 constitutes a tuning means coupled to terminals 201 and 202 of the SAW device 200 for tuning the output frequency of the tunable oscillator of the present invention. It may be appreciated that besides a varactor, other tuning means, such as a mechanically variable capacitor or a combination of a variable capacitor and an inductor, may be used across the SAW device resonator structure 20 to tune the output frequency. As described above, the SAW device 200 possesses characteristics which provide a wider tuning range for the VCO than the substantially narrow tuning range available from the conventional SAW resonators. The frequency of the oscillating portion of the VCO, i.e. the SAW device 200 and the varactor 601, is coupled to an amplifier stage. The amplifier stage comprises a transistor which provides the frequency output of the VCO. Resistors 605, 607, and 611 provide the biasing for the transistor 609 to have greater than unity gain, as is well known in the art. The output of the VCO 600 is fed back to the oscillating portion of the VCO by coupling transistor 609's emitter to common terminal 203 of the SAW device 200. As such the three-terminal SAW device 200 provides the means by which output of the VCO 600 is positively fed back.

In order to provide the wide tuning range essential to VCO circuits, the SAW device 200 possesses certain characteristics which are described below. It has been determined that the tuning range is directly proportional to the ratio of $C_m/C_0$ (see FIG. 3). Therefore, widest tuning range is provided when the ratio of $C_m/C_0$ is as high as possible. For a self resonant transducer, the ratio of $C_m/C_0$ can be expressed by the following equation:

$$C_m/C_0 \cong 8 \times K^2/\pi^2 \qquad \text{Eq. (1).}$$

Where $K^2$ is coupling coefficient of the substrate on which the SAW device 200 is implemented. The coupling coefficient represents the electro-mechanical property of piezo-electric substrate to convert electrical power to the surface-acoustic-wave power and vice versa. As seen from Equation 1, there exists a direct relationship between the coupling factor $K^2$ and the $C_m/C_0$ ratio. Thus, according to the invention, in order to achieve a substantially wide tuning range, a substrate having substantially high coupling coefficient, $K^2$, is used. It has been determined that piezoelectric substrates with high coupling coefficients, particularly those exceeding 2 percent, are suitable for use in the SAW device 200 of the present invention. Piezoelectric substrates such as lithium niobate, lithium tantalate, or lead zirconate titanate, when cut at proper angles, offer high coupling coefficient. For example, the lithium niobate when cut at a 41 degree angle exhibits coupling coefficient of approximately 17%. Other exemplary high coupling coefficient piezoelectric substrates suitable for use in the oscillator circuit of the present invention include 36 degree-cut lithium tantalate and 64 degree-cut lithium niobate.

Another factor affecting the $C_m/C_0$ ratio relates to the reflectors. As described above, the SAW device 200 as used for tunable oscillator applications is a non-reflective and self-resonant with no reflectors disposed on its opposing outer sides. As such the acoustic waves emanating from sides of the transducer are not reflected back by reflecting means conventionally used in SAW resonator structure. It has been determined that the self-resonant transducers offer a $C_m/C_0$ ratio of approximately 4 times that of transducers with reflective elements.

Furthermore, it is desirable for the oscillator to exhibit a high unloaded quality factor, $Q_u$, within the tuning range of the oscillator. The unloaded quality factor, $Q_u$, of the SAW device 200 can be expressed by the following equation:

$$Q_u = N\pi/4 \qquad \text{Eq.(2)}$$

Where N is the number of interdigitated fingers in the SAW transducer 303. However, elimination of reflective elements from the self-resonant SAW device 200 substantially reduces the unloaded quality factor $Q_u$ thereof. According to the present invention the reduction in the quality factor is compensated by increasing the number of fingers in the SAW device 200. In current state of art (that is, VCOs which utilize inductive and capacitive elements), $Q_u$ is typically within 50–250 range with greater value being more desirable. Based on Equation 2, it has been determined that a transducer with approximately 70 fingers offers $Q_u$ of 50 and one with 320 fingers after $Q_u$ of 250. Therefore, in the present invention the requirement for high $Q_u$ and wide tuning range are balanced by utilizing a high coupling coefficient piezoelectric substrate and a non-reflective, self-resonant resonator having a transducer with a number of fingers for compensating some of $Q_u$ degradation caused by elimination of the reflectors. As described above, the number of fingers may be increased by disposing one or more transducer portions having sub-transducers which are connected in parallel to the sub-transducers 210 and 220 to increase the number of interdigitated fingers of the SAW device 200.

Substrates such as lithium niobate and lithium tantalate despite offering high coupling coefficient, exhibit rather poor temperature coefficient. The poor temperature coefficients exhibited by the high coupling coefficient substrates are compensated for by utilizing the SAW device 200 of the present invention in a phase-locked loop (PLL) synthesizer. This is because output feedback of the PLL would automatically compensate for instabilities caused by poor ambient temperature coefficient of the high coupling substrate 301.

Figure 7:
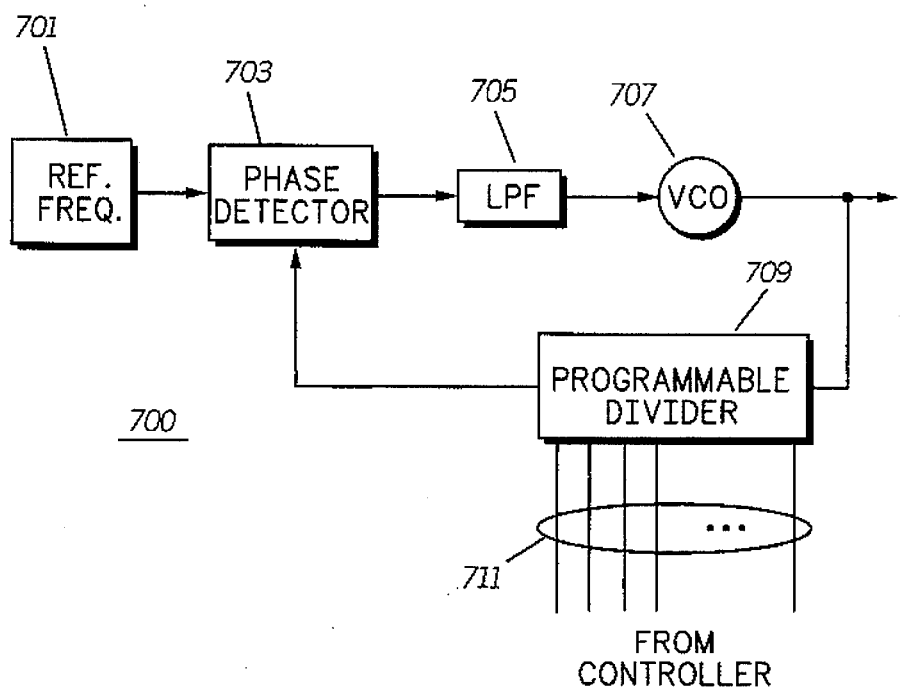
FIG. 7 is a block diagram of a phase-locked loop synthesizer which uses the oscillator of FIG. 6.

Referring to FIG. 7, a block diagram of such a PLL circuit is shown. As shown, the phase-lock loop circuit 700 includes a VCO 707 having its output fed to a well known programmable divider 709. The VCO 707 comprises a VCO constructed according to the principals of the present invention including the SAW device 200. The programmable divider 709 receives divider signals 711 from a controller or other suitable source for setting the desired frequency output of the PLL. The output of the programmable divider is applied to a well known phase detector 703 which compares the phase of the divider's output with the phase of a reference signal as provided by a high stability reference frequency source 701. An error signal produced by the phase detector and corresponding to the phase difference between the programmable divider and the reference frequency is applied to a low pass filter 705. The output of the low pass filter is applied to the VCO 707 as a tuning signal for providing a desired output frequency of the VCO. Output of the VCO is fed back to the divider 709 and, as such, any variations in the frequency output is compensated by minimizing the error signal at the output of the phase detector 701. Because of the output feedback loop in the phase-lock loop circuit, any temperature variation would be compensated for by the loop itself and, therefore, the need for a highly-stable temperature coefficient substrate in the VCO is eliminated. As a result, a high coupling coefficient substrate (with poor temperature coefficient) could be used in the SAW transducer section of the VCO 707, thereby allowing for a wide tuning range as contemplated by the present invention.

Figure 8:
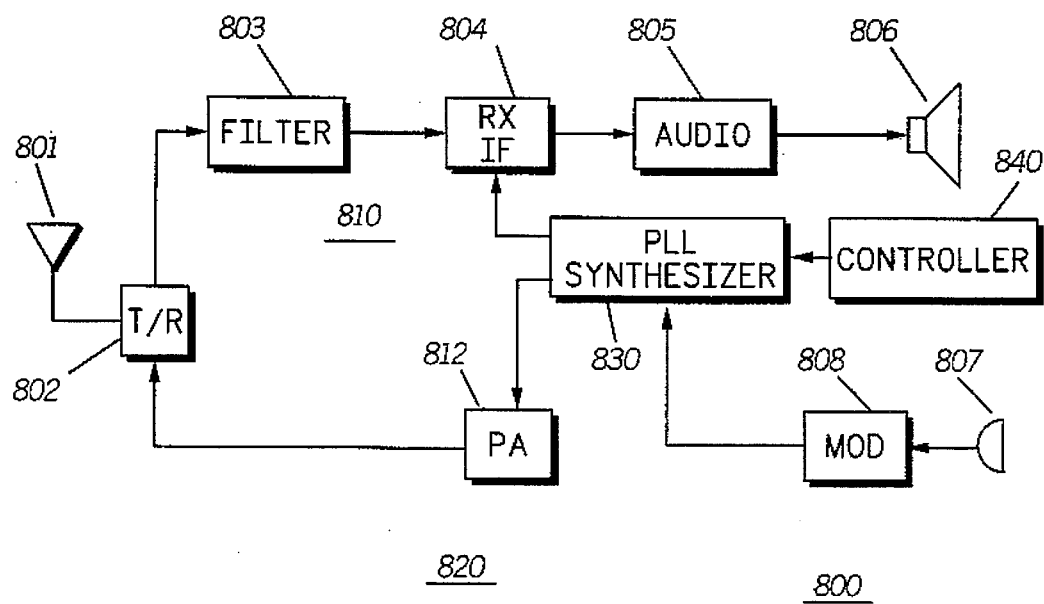
FIG. 8 is a block diagram of a radio which uses the oscillator of FIG. 6.

Referring to FIG. 8, the voltage controlled oscillator and the PLL synthesizer of the present invention are utilized in a radio 800. The radio 800 comprises a two-way radio, which may operate in either receive or transmit modes. The radio 800 includes a receiver section 810, and a transmitter section 820 which comprise means for communicating communication messages, on a receiver and transmitter carder frequencies. The radio 800 also includes a PLL synthesizer section 830 of the present invention which under control of a controller 840 tunes the transmitter and the receiver sections 810 and 820 to operate within a desired frequency band. As is well known in the art, the controller 840 provides the control signals for setting the phase locked loop synthesizer at a particular receive or transmit frequency. The PLL synthesizer 830 incorporates the VCO of the present invention for providing frequency outputs corresponding to receiver and transmitter carrier frequencies.

In the receive mode, the portable radio 800 is tuned to receive a communication signal via an antenna 801. A transmit/receive (T/R) switch 802 couples the received communication signal to a filter 803 which provides the desired selectivity for the received communication signal. The output of the filter 803 is applied to a well-known receiver IF section 804 which recovers the base band signal. The output of the receiver IF section is applied to a well-known audio section 805 which, among other things, amplifies audio messages and presents them to a speaker 806. It may be appreciated by one of ordinary skill in the art that the control signal for setting the output frequency of the synthesizer 830 and consequently the carrier frequency of the receiver is provided by the controller 840, which also controls the entire operation of the radio 800.

In the transmit mode, audio messages are inputted via a microphone 807, the output of which is applied to a well-known modulator 808 to provide a frequency modulating signal for the PLL synthesizer section 830. A transmitter power amplifier 812 amplifies the output of the modulated PLL synthesizer and applies it to the antenna 801 through the T/R switch 802 for transmission of the communication signal. Similar to receiver carrier frequency, the transmitter carrier frequency is provided by the PLL synthesizer 830 of the present invention under the control of the controller 840.

As described above, the three-terminal SAW device of the present invention provides a simple and reliable means for producing an oscillator circuit using SAW technology. The SAW device of the present invention eliminates the need for using electromagnetic inductive element of conventional VCO circuits while reducing the number of parts necessary for providing the positive feed back necessary in oscillator circuits. Furthermore, unlike conventional VCOs, the SAW device of the present invention makes SAW oscillator circuit immune to external factors, such as microphonics, caused by electromagnetic field changes surrounding the oscillator circuit.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A three-terminal SAW device resonant at a resonant frequency, comprising:

a piezoelectric substrate having a three-terminal SAW structure;

the SAW structure comprising a plurality of SAW transducer portions being disposed on said piezoelectric substrate for generating acoustic waves in response to an electrical signal, the plurality of transducer portions being acoustically coupled to propagate the acoustic waves in phase at a resonant frequency, each transducer portion including:
   a first sub-transducer comprising first and second electrodes;
   a second sub-transducer comprising first and second electrodes, wherein the second electrode of said first sub-transducer and the second electrode of said second sub-transducer are connected to each other via a common electrode to provide a serial electrical connection between the first and the second sub-transducers;
   wherein the first and second sub-transducers share a common acoustic track and have equally spaced interdigitated fingers;

wherein the first electrodes of the first sub-transducer of each of the plurality of transducer portions are electrically connected in parallel and provide a first terminal, the first electrodes of the second sub-transducers of each of the plurality of transducer portions are electrically connected in parallel and provide a second terminal, and the second electrodes of each of the plurality of transducer portions are electrically connected and provide a third terminal; and wherein the third terminal forms an input port and the first terminal forms an output port and in combination provides a tapped inductor configuration.

2. The three-terminal SAW device of claim 1, wherein said piezoelectric substrate is made of a material having a SAW coupling coefficient substantially exceeding 2%.

3. The three-terminal SAW device of claim 2, wherein said piezoelectric substrate comprises lithium niobate.

4. The three-terminal SAW device of claim 2, wherein said piezoelectric substrate comprises lithium tantalate.

5. The three-terminal SAW device of claim 2, wherein said piezoelectric substrate comprises lead zirconate titanate.

6. A three-terminal SAW device resonant at a resonant frequency, comprising:

a piezoelectric substrate having a three-terminal SAW structure;

the SAW structure comprising a plurality of SAW transducer portions being disposed on said piezoelectric substrate for generating acoustic waves in response to an electrical signal, the plurality of transducer portions being acoustically coupled to propagate the acoustic waves in phase at a resonant frequency, each transducer portion including:
   a first sub-transducer comprising first and second electrodes;
   a second sub-transducer comprising first and second electrodes, wherein the second electrode of said first sub-transducer and the second electrode of said second sub-transducer are connected to each other via a common electrode to provide a serial electrical connection between the first and the second sub-transducers;
   wherein the first and second sub-transducers share a common acoustic track and have equally spaced interdigitated fingers;

wherein the first electrodes of the first sub-transducer of each of the plurality of transducer portions are electrically connected in parallel and provide a first terminal, the first electrodes of the second sub-transducers of each of the plurality of transducer portions are electrically connected in parallel and provide a second terminal, and the second electrodes of each of the plurality of transducer portions are electrically connected and provide a third terminal; and wherein the third terminal forms an input port and the first terminal forms an output port, and in combination provides a tapped capacitor configuration.

7. A three-terminal SAW device resonant at a resonant frequency, comprising:

a piezoelectric substrate having a SAW structure comprising a plurality of SAW transducer portions for generating acoustic waves in response to an electrical signal, the plurality of transducer portions being acoustically coupled to propagate the acoustic waves in phase at a resonant frequency, each transducer portion having equally spaced interdigitated fingers and including:
   a first sub-transducer comprising first and second electrodes;
   a second sub-transducer comprising first and second electrodes, wherein the second electrode of said first sub-transducer and the second electrode of said second sub-transducer are connected to each other via a common electrode to provide a serial electrical connection between the first and the second sub-transducers, and the first and second sub-transducers are coupled in series and share a common acoustic track;

wherein the first electrodes of the first sub-transducer of each of the plurality of transducer portions are electrically connected in parallel and provide a first terminal, the first electrodes of the second sub-transducers of each of the plurality of transducer portions are electrically connected in parallel and provide a second terminal, and the second electrodes of each of the plurality of transducer portions are electrically connected and provide a third terminal.

* * * * *